(12) United States Patent
Mehas et al.

(10) Patent No.: US 11,811,369 B2
(45) Date of Patent: Nov. 7, 2023

(54) CALIBRATION AND SYNCHRONIZATION OF GROUND CURRENT SENSING AMPLIFIER WITH WIRELESS POWER TRANSMITTER CONTROLLER

(71) Applicant: Renesas Electronics America Inc., Milpitas, CA (US)

(72) Inventors: Gustavo James Mehas, Mercer Island, WA (US); Marcin Kamil Augustyniak, Zurich (CH); Giovanni Figliozzi, Zurich (CH)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 17/691,315

(22) Filed: Mar. 10, 2022

(65) Prior Publication Data
US 2023/0291365 A1    Sep. 14, 2023

(51) Int. Cl.
*H02J 50/10* (2016.01)
*H03F 3/04* (2006.01)

(52) U.S. Cl.
CPC ............ *H03F 3/04* (2013.01); *H02J 50/10* (2016.02); *H03F 2200/375* (2013.01)

(58) Field of Classification Search
CPC .. H02J 50/05; H02J 50/10; H02J 50/12; H02J 50/60; H02J 50/70; H02J 50/80; H03F 2200/375; H04B 5/0037; H04B 5/0075–0093

USPC ........................................... 307/104
See application file for complete search history.

(56) References Cited

U.S. PATENT DOCUMENTS

| 10,418,954 B1* | 9/2019 | Price ................... H03F 1/02 |
| 2008/0183098 A1* | 7/2008 | Denison ............. A61B 5/7203 330/10 |
| 2021/0124078 A1* | 4/2021 | Widmer ............... G06F 18/217 |
| 2022/0091164 A1* | 3/2022 | Guedon ............ G01R 19/0092 |

\* cited by examiner

*Primary Examiner* — Levi Gannon
(74) *Attorney, Agent, or Firm* — SCULLY, SCOTT, MURPHY & PRESSER, P.C.

(57) ABSTRACT

Systems and methods for calibrating a wireless power transmitter is described. A wireless power transmitter can include a controller and an amplifier module. The amplifier module can include an amplifier configured to amplify a voltage converted from a current proportional to power consumed by a wireless power transmitter, and a circuit connected to the amplifier. The circuit can be configured to receive a control signal from the controller. The circuit can be further configured to perform time division multiplexing on an output of the amplifier according to the control signal. A time division multiplexed output of the amplifier can include calibration data of the amplifier. The amplifier can be configured to output the time division multiplexed output to the controller.

20 Claims, 9 Drawing Sheets

CALIBRATION AND SYNCHRONIZATION OF GROUND CURRENT SENSING AMPLIFIER WITH WIRELESS POWER TRANSMITTER CONTROLLER

BACKGROUND OF THE SPECIFICATION

The present disclosure relates in general to apparatuses and methods for calibrating a ground current sensing amplifier in a wireless power transmitter.

Wireless power system can include a transmitter having a transmission coil and a receiver having a receiver coil. In an aspect, the transmitter may be connected to a structure including a wireless charging region. In response to a device including the receiver being placed on the charging region, or in proximity to the charging region, the transmission coil and the receiver coil can be inductively coupled with one another to form a transformer that can facilitate inductive transfer of alternating current (AC) power. The transfer of AC power, from the transmitter to the receiver, can facilitate charging of a battery of the device including the receiver.

SUMMARY

In an embodiment, an apparatus is generally described. The apparatus can include an amplifier and a circuit connected to the amplifier. The amplifier can be configured to amplify a voltage converted from a current proportional to power consumed by a wireless power transmitter. The circuit can be configured to receive a control signal. The circuit can be further configured to perform time division multiplexing on an output of the amplifier according to the control signal. A time division multiplexed output of the amplifier can include calibration data of the amplifier.

In another embodiment, a wireless power transmitter is generally described. The wireless power transmitter can include a controller and an amplifier module. The amplifier module can include an amplifier and a circuit connected to the amplifier. The amplifier can be configured to amplify a voltage converted from a current proportional to power consumed by the wireless power transmitter. The circuit can be configured to receive a control signal from the controller. The circuit can be further configured to perform time division multiplexing on an output of the amplifier according to the control signal. A time division multiplexed output of the amplifier can include calibration data of the amplifier. The amplifier can be further configured to output the time division multiplexed output to the controller.

In another embodiment, a method for calibrating a wireless power transmitter is generally described. The method can include sending, by a controller, a first control signal to switch on a normal operation mode of an amplifier in an analog front end (AFE) of a wireless power transmitter. The method can further include receiving, by the controller, an amplified voltage of a voltage converted from an average current proportional to power consumed by the wireless power transmitter. The method can further include sending, by the controller, a second control signal to switch on a calibration mode of the amplifier. The method can further include receiving, by the controller, calibration data of the amplifier from the amplifier.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

Figure 1:
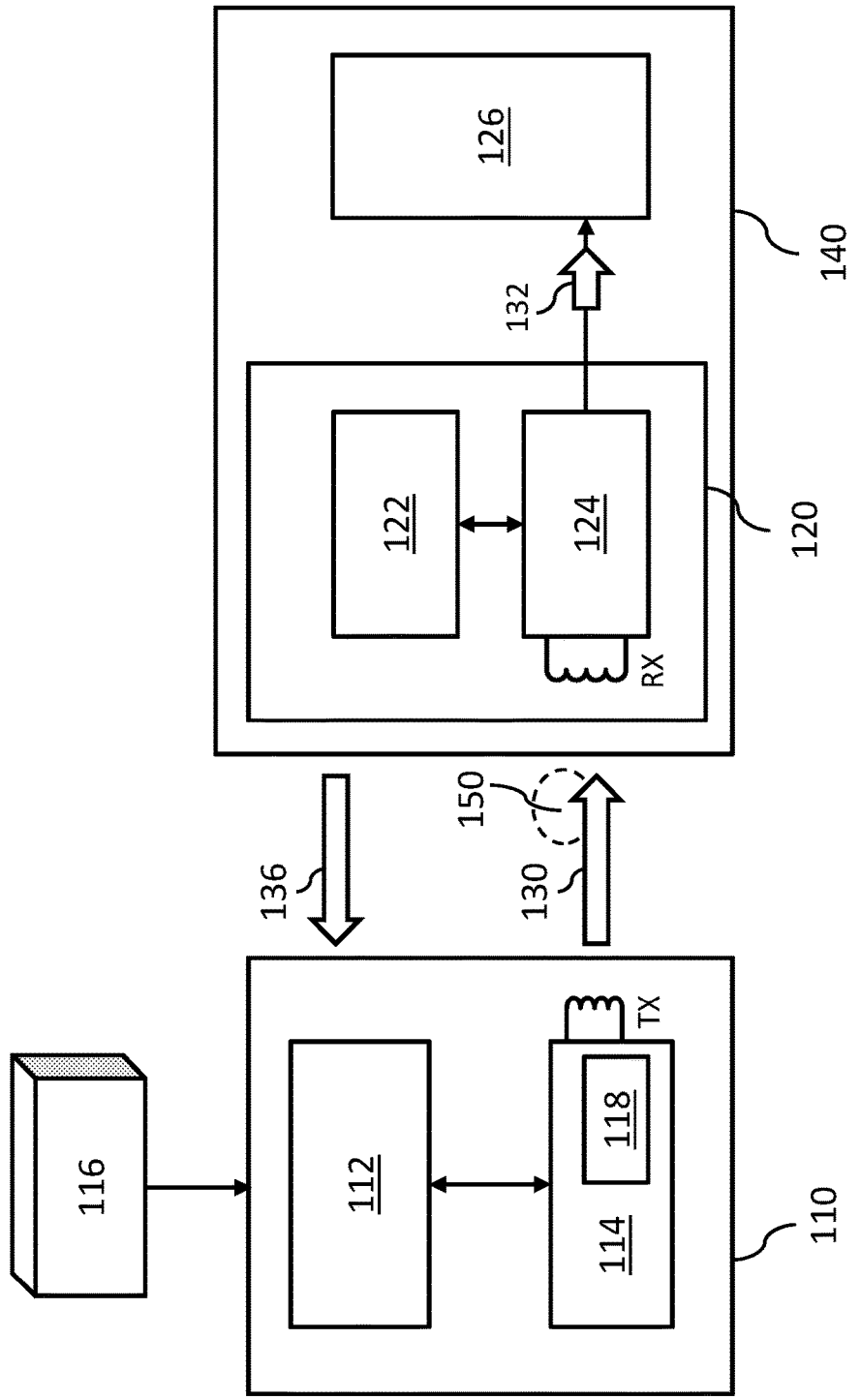
FIG. 1 is a block diagram of an example system for wireless power transfer according to an embodiment.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

In an aspect, during wireless power transfer, a foreign object that may be in proximity to the transmission coil may cause an increase in power loss, and the foreign object may heat up to a point that can potentially create a hazardous situation. Foreign object detection can be performed by a controller of the transmitter. In an aspect, the transmitter can perform foreign object detection based on current that passes through the transmitter's coil during power transfer. A ground current sensing amplifier (GCSA) can be connected between the transmitter's coil and the transmitter's controller. The GCSA can detect a current that is proportional to power being absorbed or consumed by transmitter and converts the detected current into voltage. In an aspect, the power being absorbed or consumed by the transmitter can be power dissipated by loads on the transmitter and loads coupled to the transmitter via magnetic induction. The transmitter's controller can use the voltage outputted from the GCSA to perform functions such as foreign object detection, or to determine various control parameters that may control a performance of the transmitter.

In an aspect, the voltage being outputted by the GCSA may include errors, such as an offset error or a gain error. An offset error can be a value that is deemed by the GCSA as a difference between the effective GCSA input voltage and the actual GCSA input voltage. A gain error can be a factor that multiplies the voltage being outputted by the GCSA. The accuracy of the GCSA can affect the performance of the transmitter, such as the accuracy of foreign object detection being performed by the transmitter.

The GCSA can be calibrated to identify the offset error and the gain error. In an aspect, the transmitter's controller can calibrate the GCSA. However, using the transmitter's controller to calibrate the GCSA can raise challenges. These challenges can be due to the controller being separated from the GCSA. In order to interface the separated controller and GCSA, analog traces are required to connect the GCSA to the controller. Further, GCSA output filters with specific time constants (e.g., one millisecond (ms) and one hundred microseconds (μs)) may be required between the GCSA and the controller, which further separates the GCSA from the controller. These filters, and the separation distance between the GCSA and the controller, can slow down the transmission of the GCSA output voltage to the controller for calibration. Also, the GCSA can report negative current, but a certain analog-to-digital converter (ADC) (that may be in the controller) cannot measure below ground, and therefore a zero value (e.g., a specific voltage, such as 0.5 volts (V)) must be agreed upon by the ADC and the controller. To be described in more detail below, the apparatus described herein provides an amplifier module that can perform the functions of the GCSA and also generate calibration data under different calibration modes. The amplifier module can operate in calibration mode during specific time windows, and generate calibration data that can be outputted as time division multiplexed signals to avoid interfering with normal operations of the transmitter. By using the disclosed amplifier module to perform calibration and generate calibration data, the amplifier module can output calibration data that can be directly processed and stored by the controller, and can avoid having an ADC in the controller measuring negative voltage. Also, the ADC (which may be part of the controller or external to the controller) is implemented external to the amplifier module, and filters along analog traces connecting this external ADC with the amplifier module can be configured to reduce time constants for system stabilization and speed up transitions between normal operation mode and different calibration modes.

FIG. 1 is a diagram showing an example system 100 that implements wireless power transfer and communication according to an illustrative embodiment. System 100 can include a transmitter 110 and a receiver 120 that are configured to wirelessly transfer power and data therebetween via inductive coupling. While described herein as transmitter 110 and receiver 120, each of transmitter 110 and receiver 120 may be configured to both transmit and receive power or data therebetween via inductive coupling.

Transmitter 110 is configured to receive power from one or more power supplies and to transmit AC power 130 to receiver 120 wirelessly. For example, transmitter 110 may be configured for connection to a power supply 116 such as, e.g., an adapter or a DC power supply. Transmitter 110 can include a controller 112 and a power driver 114.

Controller 112 can be configured to control and operate power driver 114. Controller 112 can include, for example, a processor, central processing unit (CPU), field-programmable gate array (FPGA) or any other circuitry that is configured to control and operate power driver 114. While described as a CPU in illustrative embodiments, controller 112 is not limited to a CPU in these embodiments and may comprise any other circuitry that is configured to control and operate power driver 114. In an example embodiment, controller 112 can be configured to control power driver 114 to drive a coil TX of the power driver 114 to produce a magnetic field. Power driver 114 can be configured to drive coil TX at a range of frequencies and configurations defined by wireless power standards, such as, e.g., the Wireless Power Consortium (Qi) standard, the Power Matters Alliance (PMA) standard, the Alliance for Wireless Power (A for WP, or Rezence) standard or any other wireless power standards.

Receiver 120 can be configured to receive AC power 130 transmitted from transmitter 110 and to supply the power to one or more loads 126 or other components of a destination device 140. Load 126 may comprise, for example, a battery charger that is configured to charge a battery of the destination device 140, a DC-DC converter that is configured to supply power to a processor, a display, or other electronic components of the destination device 140, or any other load of the destination device 140. Destination device 140 may comprise, for example, a computing device, mobile device, mobile telephone, smart device, tablet, wearable device or any other electronic device that is configured to receive power wirelessly. In an illustrative embodiment, destination device 140 can include receiver 120. In other embodiments, receiver 120 may be separate from destination device 140 and connected to destination device 140 via a wire or other component that is configured to provide power to destination device 140.

Receiver 120 can include a controller 122 and a power rectifier 124. Controller 122 can include, for example, a processor, central processing unit (CPU), field-programmable gate array (FPGA) or any other circuitry that may be configured to control and operate power rectifier 124. Power rectifier 124 includes a coil RX and is configured to rectify power received via coil RX into a power type as needed for load 126. Power rectifier 124 is configured to rectify AC power received from coil RX into DC power 132 which may then be supplied to load 126.

As an example, when receiver 120 is placed in proximity to transmitter 110, the magnetic field produced by coil TX of power driver 114 induces a current in coil RX of power rectifier 124. The induced current causes AC power 130 to be inductively transmitted from power driver 114 to power rectifier 124. Power rectifier 124 receives AC power 130 and converts AC power 130 into DC power 132. DC power 132 is then provided by power rectifier 124 to load 126.

Transmitter 110 and receiver 120 are also configured to exchange information or data, e.g., messages, via the inductive coupling of power driver 114 and power rectifier 124. For example, before transmitter 110 begins transferring power to receiver 120, a power contract may be agreed upon and created between receiver 120 and transmitter 110. For example, receiver 120 may send communication packets 136 or other data to transmitter 110 that indicate power transfer information such as, e.g., an amount of power to be transferred to receiver 120, commands to increase, decrease, or maintain a power level of AC power 130, commands to stop a power transfer, or other power transfer information. In another example, in response to receiver 120 being brought in proximity to transmitter 110, e.g., close enough such that a transformer may be formed by coil TX and coil RX to allow power transfer, receiver 120 may be configured to initiate communication by sending a signal to transmitter 110 that requests a power transfer. In such a case, transmitter 110 may respond to the request by receiver 120 by establishing the power contract or beginning power transfer to receiver 120, e.g., if the power contract is already in place. Transmitter 110 and receiver 120 may transmit and receive communication packets, data or other information via the inductive coupling of coil TX and coil RX. In some embodiments, communication between transmitter 110 and receiver 120 can occur before power transfer stage using various protocols such as near field communication (NFC), Bluetooth, etc.

In one embodiment, power driver 114 can include an analog front end (AFE) 118, where AFE 118 can be an integrated circuit (IC) that interface the coil TX to controller 112. AFE 118 can include a set of analog signal conditioning circuit components, such as analog amplifiers (e.g., operational amplifiers), filters, and application-specific integrated circuits, radio receivers, and other circuit components. Controller 112 can communicate with AFE 118 using one or more signals such as, e.g., pulse-width modulation (PWM) signals, control signal, or other signals, to control and operate power driver 114 to provide power to receiver 120 using coil TX, or to obtain various data or parameters from power driver 114 and/or receiver 120.

In one embodiment, AFE 118 can be configured to detect a current proportional to power being absorbed or consumed by transmitter 110 and convert the detected current into voltage. In an aspect, the power being absorbed or consumed by transmitter 110 can be power dissipated by loads on transmitter 110 and loads coupled to transmitter 110 via magnetic induction. Controller 112 can use the voltage outputted from AFE 118 to perform functions such as foreign object detection, or to determine various control parameters that may control a performance of the transmitter. For example, if a foreign object 150 is present between the coils TX and RX, the voltage being outputted by AFE 118 can be abnormal (e.g., deviated from an expected voltage of level of AC power 130). Controller 112 can perform foreign object detection by detecting anomaly in the voltage being outputted by AFE 118.

In an aspect, if components (e.g., operational amplifier implemented as GCSA) in AFE 118 are not calibrated, the voltage being outputted by AFE 118 can include errors such as an offset error or a gain error. The offset error can be caused by mismatches between differential input transistors of an operational amplifier in AFE 118 created during manufacturing process. The gain error can be caused by signal distortions from signal processing performed by a component in AFE 118, such as amplification by an operational amplifier in AFE 118. Gain error can also be caused by tolerances in the manufacturing process of transmitter 110. To be described in more detail below, AFE 118 can include an amplifier module configured to amplify a voltage level of current proportional to power being consumed or absorbed by transmitter 110 during power transfer stage of the system 100, and also perform auto-calibration. AFE 118 can output the amplified voltage signal level and calibration data from the auto-calibration as time division multiplexed output.

Figure 2:
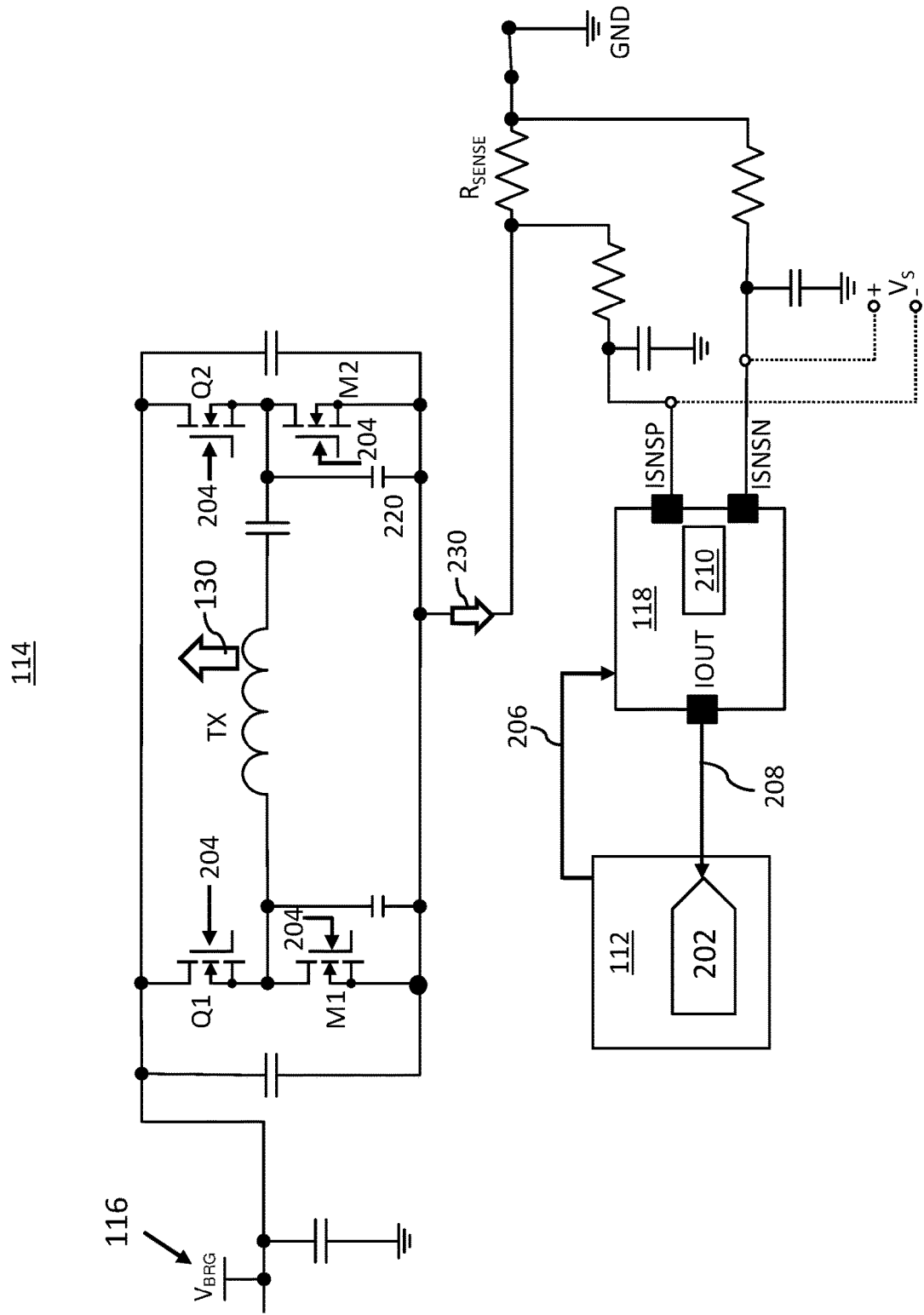
FIG. 2 is a circuit diagram illustrating details of an example transmitter of the system of FIG. 1 in one embodiment.

FIG. 2 is a circuit diagram illustrating an example transmitter of the system of FIG. 1 in one embodiment. Additional details of power driver 114 is shown in FIG. 2. Power driver 114 can include a plurality of switching elements labeled as Q1, Q2, M1, M2. In one embodiment, switching elements Q1, Q2, M1, M2 can be metal-oxide-semiconductor field-effect transistors (MOSFETs). Switching elements Q1, Q2 can be referred to as high-side switching elements, and switching elements M1, M2 can be referred to as low-side switching elements. Switching elements Q1, Q2, M1, M2 can form a H-bridge inverter in power driver 114.

AFE 118 can be configured to switch on one or more of switching elements Q1, Q2, M1, M2 by providing gate bias voltages 204 to switching elements Q1, Q2, M1, M2. AFE 118 can be configured to switch off switching elements Q1, Q2, M1, M2 by not providing gate bias voltages 204. Switching elements Q1, M2 can be switched on simultaneously while switching elements Q2, M1 are switched off. Switching elements Q2, M1 can be switched on simultaneously while switching elements Q1, M2 are switched off. Power supply 116 can provide DC power having a voltage $V_{BRG}$ to power driver 114. When switching elements Q1, M2 are switched on, current generated by $V_{BRG}$ can flow to the coil TX via switching elements Q1, M2. When switching elements Q2, M1 are switched on, current generated by $V_{BRG}$ can flow to the coil TX via switching elements Q2, M1. The coil TX can output AC power 130 in response to receiving the current generated by $V_{BRG}$.

AFE 118 can perform current sensing by sensing current 230 at a node 220 connected to switching elements Q1, Q2, M1 and M2. Current 230 can be current that is proportional to power being absorbed or consumed by transmitter 110, including power being absorbed by any secondary circuits in transmitter 110. In an aspect, the power being consumed by transmitter 110 can be power provided by $V_{BRG}$, which causes current to flow throughout different circuit components in transmitter 110. A sense resistor $R_{SENSE}$ can be connected between node 220 and GND. A set of input pins ISNSP and ISNSN of AFE 118 can be connected across $R_{SENSE}$ to measure or detect a differential voltage $V_S$ across $R_{SENSE}$ (e.g., a sense voltage $V_S$), where $V_S$ is proportional to current 230. An output pin IOUT of AFE 118 can be connected to an analog-to-digital converter (ADC) 202, where ADC 202 is a part of the controller 112.

AFE 118 can include a circuit 210. Circuit 210 can be an integrated circuit including circuit various components, such as an amplifier and a plurality of switches. The switches in circuit 210 can be opened (e.g., switched off) to disconnect specific signal paths in AFE 118, or closed (e.g., switched on) to connect specific signal paths in AFE 118 (described below). Controller 112 can provide control signals 206 to AFE 118 to control the switches in circuit 210. As a result of switching different combinations of switches in circuit 210, AFE 118 can operate between a normal operation mode and one or more calibration modes. Under normal operation mode, an output signal 208 from AFE 118 can be an amplified version of $V_S$. Under a calibration mode, output signal 208 can include calibration data of a component (e.g., an amplifier) in AFE 118. The output signal 208 can include time division multiplexed signals where the amplified voltage and calibration data from the IOUT pin is transmitted to controller 112 in a synchronized and sequential manner. In one embodiment, AFE 118 can operate under different calibration modes such as auto zero calibration, auto gain calibration, and zero current reference voltage calibration.

In one embodiment, controller 112 can be configured to switch AFE 118 between normal operation mode and calibration mode based on predefined timings of specific wireless power transfer protocols. For example, under the Qi protocol, a dead time or timeout occurs between consecutive transmission of specific data packets, such as control error packets (CEP) or received power packets (RPP), from receiver 120. Under this dead time between consecutive data packets, the need for controller 112 to monitor the amplified version of $V_S$ is suspended. Controller 112 can be configured to identify this dead time, and switch AFE 118 from normal operation mode to calibration mode within this dead time between consecutive data packets received by transmitter 110. Controller 112 can be further configured to switch AFE 118 from calibration mode to normal operation mode before a lapse of the dead time. By configuring controller 112 to switch AFE 118 between normal operation mode and calibration mode within a dead time, operations of AFE 118 is not interfered by the calibration mode.

Figure 3:
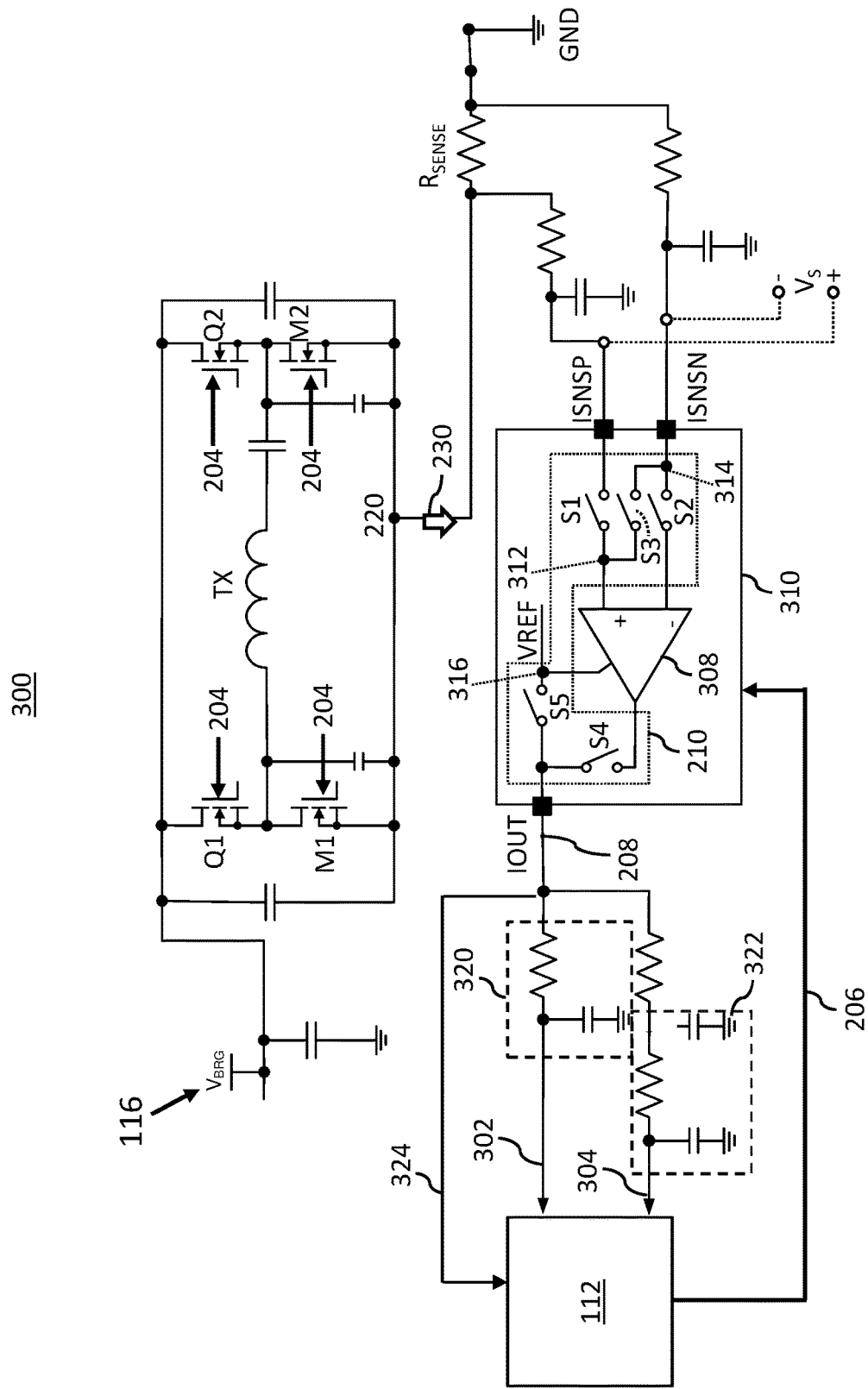
FIG. 3 is a circuit diagram illustrating details of an amplifier module that can implement calibration and synchronization of ground current sensing amplifier with wireless power transmitter controller in one embodiment.

FIG. 3 is a circuit diagram illustrating details of an amplifier module that can implement calibration and synchronization of ground current sensing amplifier with wireless power transmitter controller in one embodiment. In an example shown in FIG. 3, AFE 118 in FIG. 1 and FIG. 2 can include an amplifier module 310. Amplifier module 310 can include an amplifier 308 and circuit 210 shown in FIG. 2. Amplifier 308 can be a ground current sensing amplifier (GCSA) of AFE 118. Circuit 210 can include a plurality of switches S1, S2, S3, S4, S5. Amplifier module 310 can be connected to input pins ISNSP, ISNSN, and the output pin IOUT of AFE 118.

Amplifier 308 can be an operational amplifier configured to receive differential voltage $V_S$ across $R_{SENSE}$ and amplify $V_S$. S1 can be connected between $R_{SENSE}$ and a non-inverting input terminal of amplifier 308. S2 can be connected to $R_{SENSE}$ and an inverting input terminal of amplifier 308. S3 can be connected to a node 312 and a node 314. Node 312 can be between S1 and the non-inverting input terminal of amplifier 308. Node 314 can be between S2 and the input ISNSN of amplifier module 310. S4 can be connected to an output terminal of amplifier 308 and IOUT pin of AFE 118. S5 can be connected between a reference voltage VREF and a node 316 between S4 and the output terminal of amplifier 308. The arrangement and connections of switches S1, S2, S3, S4, S5 shown in FIG. 3 is one embodiment of the present disclosure, and other embodiments having different arrangements and connections, and/or additional switches, can be implemented depending on a desired configuration of transmitter 110. For example, the embodiment where S3 is connected between nodes 312, 314 shown in FIG. 3 can be applicable for designs where amplifier 308 does not have an infinite input impedance. Another embodiment where S3 is connected in a different position can be applicable for designs where amplifier 308 has an infinite input impedance.

Controller 112 can generate and send control signals 206 to switch on or switch off one or more switches among S1, S2, S3, S4, S5. Different combinations of switches among S1, S2, S3, S4, S5 being switched on can cause AFE 118 to operate under normal operation mode or different types of calibration modes. Different types of calibration modes can cause amplifier 308 to output different types of calibration data via IOUT pin. For example, under normal operation mode, amplifier 308 can output an amplified version of $V_S$ on a trace 324. Under an auto zero calibration mode, output signal 208 can be an auto zero offset voltage. Under an auto gain calibration mode, output signal 208 can be a reference gain voltage. Under a zero current reference voltage mode, output signal 208 can be reference voltage VREF.

Controller 112 can generate and provide control signals 206 based on timings of power and signals being exchanged between transmitter 110 and receiver 120 of system 100 shown in FIG. 1. In one embodiment, controller 112 can be configured to monitor a sequence of data packets being received by transmitter 110. Controller 112 can compare the monitored sequence with a predefined sequence of data packets stored in a memory device of controller 112. The predefined sequence of data packets can indicate an expected sequence of data packets being received by transmitter 110 from receiver 120, and dead time or timeout between receipt of consecutive data packets. For example, a memory device of controller 112 can store a predefined sequence of data packets and dead time durations under a power transfer stage of the Qi protocol. Controller 112 can be configured to switch AFE 118 between normal operation mode and at least one calibration mode during one or more specific dead time indicated by the predefined sequence of data packets.

Calibration data outputted as output signal 208 can be a time division multiplexed signal, such as including one or more signals that are being transmitted from amplifier module 310 to controller 112 in a synchronized manner (e.g., each signal appears on a signal path between IOUT pin and controller 112 for a defined time interval). In the example shown in FIG. 3, one or more filters, such as filters 320, 322, can be connected between IOUT pin and controller 112 to delay output signal 208. Each filter can delay output signal 208 by a specific time constant. The time constant defined by a filter can be dependent on the filter's components such as component size, resistance of resistors, capacitance of capacitors, and/or the filter's impedance. In one embodiment, switching between normal operation mode and different calibration modes may require the system (e.g., controller 112) to be stabilized. For example, in a switch from normal operation mode to auto zero calibration mode, all filters connected to the input paths of controller 112 (e.g., filters 320, 322) need to be stabilized to accommodate time division multiplexing of calibration data in output signal 208. Then, in a switch from auto zero calibration mode back to normal operation mode, all filters connected to the input paths of controller 112 (e.g., filters 320, 322) need to be stabilized to accommodate the amplified version of $V_S$ that is being continuously monitored by controller 112. The impedances of the filters 320, 322, can be adjustable to speed up the wait time for stabilizing the filters 320, 322. In one embodiment, resistors and/or capacitors in filters 320, 322 can be variable resistors and/or variable capacitors, respectively, such that impedances of filters 320, 322 can be adjusted by controlling the variable resistors and variable capacitors. In another embodiment, MOSFETs can be connected across resistors in filters 320, 322 and these MOSFETs can be switched on or off to adjust the overall resistance and impedance of filters 320, 322. Also, in the example shown in FIG. 3, the amplified version of $V_S$ can be provided to controller 112 via trace 324 that has no filter, such that a time window for time division multiplexing output signal 208 can be decreased when the amplified version of $V_S$ is not being outputted to filters 320, 322.

In one embodiment, the types of communication packets being received by transmitter 110 can impact the dead time available for time division multiplexing calibration data in output data 208. For example, in FOD, receiver 120 may send received power packets (RPP) but not control error packets (CEP). Thus, a dead time between consecutive RPPs may be larger than packets received under demodulation modulations where CEPs may be received by transmitter 110 at a faster rate (e.g., less dead time). The different dead times between packets can affect the time window available for time division multiplexing calibration data and switching between normal operation mode and calibration modes. Information regarding the different time constants defined by different filters, and RPP or CEP receipt rates, can be stored in memory devices of controller 112 can allow controller 112 to determine an appropriate dead time for performing time division multiplexing and switching AFE 118 between normal operation mode and calibration modes. Based on stored sequences of data packet and timings in controller 112, controller 112 can determine an amount of available dead time to perform calibration using amplifier module 310. If ASK demodulation is not being performed by controller 112 (e.g., controller 112 is only performing FOD), then controller 112 may have a larger window, or more dead time, between consecutive RPPs to monitor and perform time division multiplexing on calibration data received from AFE 118, and to switch AFE 118 between normal operation mode and calibration modes. If both FOD and ASK demodulation are being performed by controller 112, then controller 112 may have a smaller window, or less dead time, between consecutive CEPs to perform time division multiplexing of calibration data and to switch AFE 118 between normal operation mode and calibration mode.

In one embodiment, controller 112 can be configured to learn patterns of data packets and dead time durations, and determine whether to switch between normal operation mode and calibration mode based on the learned patterns. For example, a predefined dead time between consecutive RPPs can be T1. However, due to various variation (e.g., temperature and process variations), an average dead time between historical RPPs received by transmitter 110 can be T1+C. Therefore, controller 112 can determine that the available dead time for calibration can be T1+C, instead of T1. In an aspect, CEP and RPP packets can appear in the same channel. Thus, when an RPP arrives, there is less dead time between two CEP packets. In an example, if there is a dead time of 500 milliseconds (ms) between CEP packets, but an RPP packet is injected every 5 seconds, there is only 200 ms of dead time from CEP to RPP then again to the next RPP (if receiver 140 places the RPP right in the middle of the two CEPs). In another example, controller 112 can be configured to switch AFE 118 from calibration mode to normal operation mode in response to specific events, even though there is still available dead time for calibration. For example, in response to a load transient event, controller 112 can switch AFE 118 from calibration mode to normal operation mode even though there is still available dead time for calibration, or may not start calibration mode if calibration mode has yet to start.

Figure 4A:
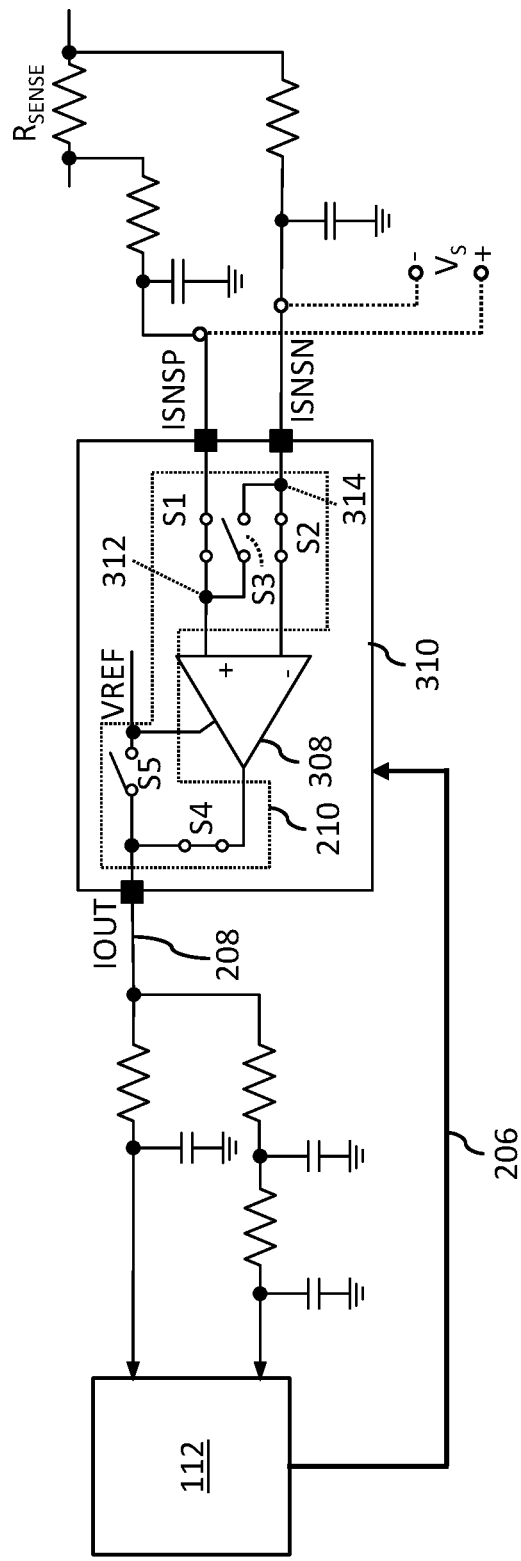
FIG. 4A is a circuit diagram illustrating a first state of the amplifier module of FIG. 3 in one embodiment.

FIG. 4A is a circuit diagram illustrating a first state of the amplifier module 310 of FIG. 3 in one embodiment. First state 400 shown in FIG. 4A illustrates amplifier module 310 under a normal operation mode. In first state 400, the control signal 206 provided by controller 112 can switch on S1, S2, and S4. In response to S1, S2, S4 being switched on, input terminals of amplifier 308 can be connected to $R_{SENSE}$ via the pins ISNSP and ISNSN, and the output terminal of amplifier 308 can be connected to IOUT pin. By connecting amplifier 308 to $R_{SENSE}$ and IOUT, output signal 208 being outputted by amplifier 308 can be an amplified version of $V_S$.

Figure 4B:
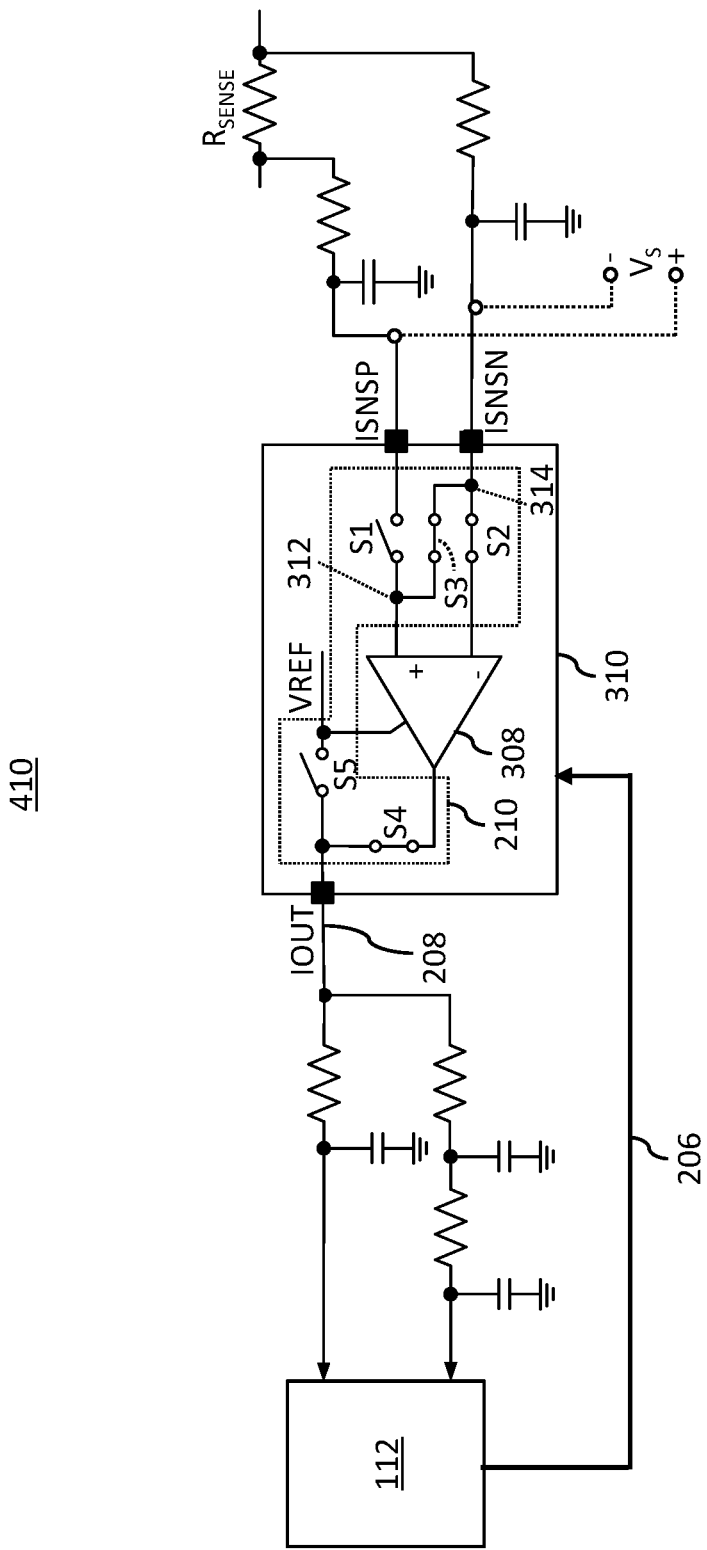
FIG. 4B is a circuit diagram illustrating a second state of the amplifier module of FIG. 3 in one embodiment.

FIG. 4B is a circuit diagram illustrating a second state 410 of the amplifier module of FIG. 3 in one embodiment. Second state 410 shown in FIG. 4B illustrates amplifier module 310 under an auto zero calibration mode. In second state 410, the control signal 206 provided by controller 112 can switch on S2, S3 and S4. In response to S2, S3, S4 being switched on, input terminals of amplifier 308 can be disconnected from $R_{SENSE}$, and the output terminal of amplifier 308 can be connected to IOUT pin. Node 312 and node 314 can be connected in response to switching on S3. By disconnecting the non-inverting input terminal of amplifier 308 from $R_{SENSE}$, connecting ISNSN to the inverting input terminal of amplifier 308, and connecting amplifier 308 to IOUT, output signal 208 being outputted by amplifier 308 can be an auto zero offset voltage that indicates an offset error of amplifier 308. The offset error of amplifier 308 can be a value that is deemed as a zero by amplifier 308, and the offset error can be a zero or a non-zero value. Note that under second state 410, S2 may be switched on (e.g., closed) during auto-zero calibration to provide a current discharge path to ground. In one embodiment, switch S2 may be an optional switch, such that if S2 is absent from amplifier module 310, ISNSN and the inverting input terminal of amplifier 308 can be connected permanently.

Figure 4C:
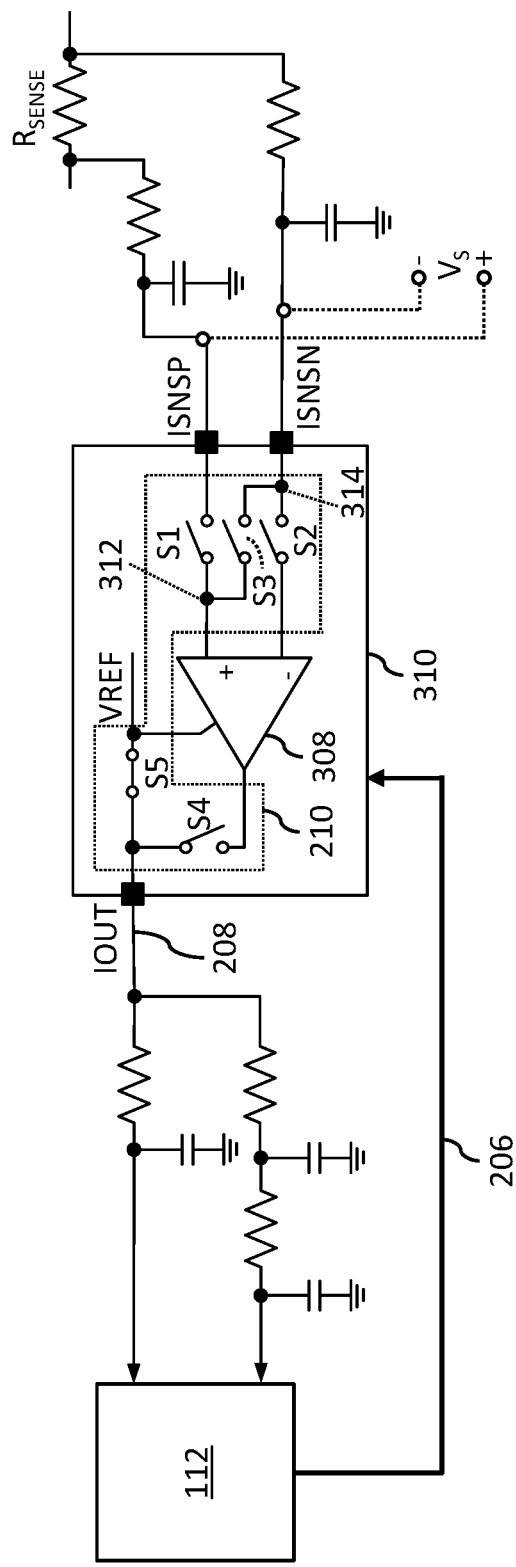
FIG. 4C is a circuit diagram illustrating a third state of the amplifier module of FIG. 3 in one embodiment.

FIG. 4C is a circuit diagram illustrating a third state 420 of the amplifier module of FIG. 3 in one embodiment. Third state 420 shown in FIG. 4C illustrates amplifier module 310 under a zero current reference voltage calibration mode. In third state 420, the control signal 206 provided by controller 112 can switch on S5. In response to S5 being switched on, input terminals of amplifier 308 can be disconnected from $R_{SENSE}$ and the output terminal of amplifier 308 can be disconnected from IOUT pin. The reference voltage VREF can be connected to IOUT. By connecting VREF to IOUT, output signal 208 being outputted by amplifier 308 can be the reference voltage VREF.

Figure 4D:
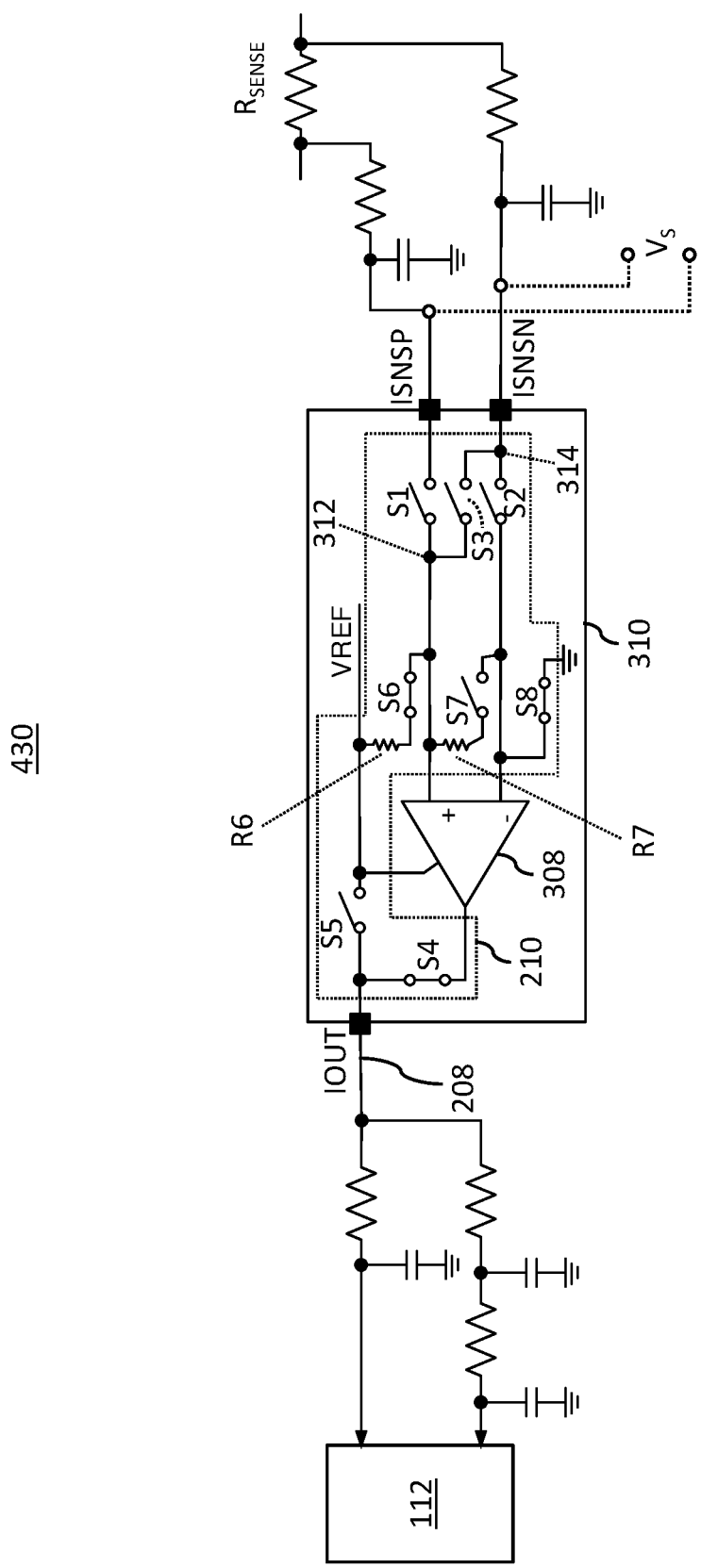
FIG. 4D is a circuit diagram illustrating a fourth state of the amplifier module of FIG. 3 in one embodiment.

FIG. 4D is a circuit diagram illustrating a fourth state of the amplifier module of FIG. 3 in one embodiment. In one embodiment, circuit 210 in amplifier module 310 can include additional switches S6, S7, S8. Switch S6 can be connected between VREF and a node between S1 and the non-inverting input terminal of amplifier 308 and a ground node. Switch S7 can be connected between a node between S1 and the non-inverting input terminal of amplifier 308, and a node between S2 and the inverting input terminal of amplifier 308. Switch S8 can be connected between S2 and the inverting input terminal of amplifier 308. Fourth state 430 shown in FIG. 4D illustrates amplifier module 310 under an auto gain calibration mode. In fourth state 430, the control signal 206 provided by controller 112 can switch on S4, S6, and S8. In response to S4, S6 and S8 being switched on, the non-inverting input terminals of amplifier 308 can be connected to VREF, the inverting input terminal of amplifier 308 can be connected to ground, and the output terminal of amplifier 308 can be connected to IOUT pin. By connecting input terminals of amplifier 308 to VREF and ground, output signal 208 being outputted by amplifier 308 can be a reference gain voltage that can be a divided down version of VREF imposed on the input terminals of amplifier 308. Switch S7 can be optionally switched on or off depending on an input range of amplifier 308. For example, if VREF is in the same order of magnitude as the input voltage into amplifier 308, then S7 may remain switched off. In some embodiments, S7 can be switched on to further scale or divide down VREF. Further, a resistor R6 is connected in series to switch S6 and a resistor R7 is connected in series to switch S7. Resistance provided by resistors R6, R7 can scale down VREF in response to S6, S7 being switched on, respectively (e.g., without R6, R7 VREF may remain the same and will not be scaled down). Output signal 208 under state 430 can include a gain error of amplifier 308 that can be a factor that multiplies a voltage being outputted by amplifier 308.

In response to performing calibration under states 410, 420 shown in FIG. 4B and FIG. 4C, respectively, controller 112 can store the auto zero offset voltage of amplifier 308 and the reference voltage VREF in a memory device. In response to performing calibration under state 430, controller 112 can deduct the stored auto zero offset voltage of amplifier 308 and VREF from the reference gain voltage received in state 430 to determine the gain error of amplifier 308. Controller 112 can store the gain error of amplifier 308 in the memory device as well. Controller 112 can use the stored auto zero offset voltage and gain error of amplifier 308 to process future output signals from amplifier 308. For example, in response to receiving a new output signal indicating an amplified voltage from amplifier 308, controller 112 can deduct the stored auto zero offset voltage and gain error from the new output signal compensate errors that may be present in the new output signal.

By integrating circuit 210 (see FIG. 2) with a GCSA (e.g., amplifier 308) of AFE 118 (see FIG. 1), output signals from the GCSA can be time division multiplexed. The time division multiplexing allows calibration data to be outputted from the GCSA during dead time during power transfer stage. Circuit 210 can implement relatively small and simple switches (e.g., MOSFETs), providing a relatively inexpensive solution to calibrate GCSA. Further, by configuring GCSA to perform auto-calibration, the GCSA can output calibration data to controller 112 without a need for controller 112 to perform complex calculations to determine the offset error and gain error of the GCSA. Furthermore, the auto-calibration can be performed during a dead time or timeout under a power transfer phase of transmitter 110 without interfering with the power transfer.

Figure 5A:
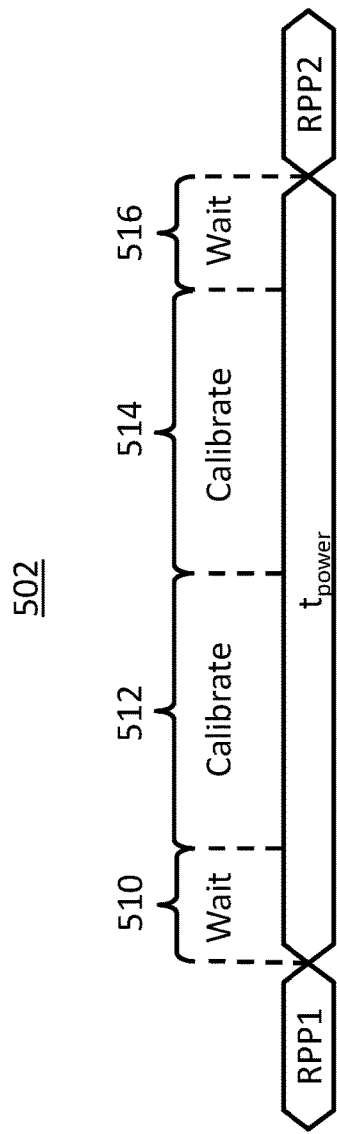
FIG. 5A is a timing diagram of an implementation of calibration and synchronization of ground current sensing amplifier with wireless power transmitter controller in one embodiment.

FIG. 5A is a timing diagram of an implementation of calibration and synchronization of ground current sensing amplifier with wireless power transmitter controller in one embodiment. In FIG. 5A, a timing diagram 502 is shown where a dead time $t_{power}$ is available between consecutive RPPs, RPP1 and RPP2, for controller 112 to switch AFE 118 from normal operation mode into calibration mode. To switch between normal operation mode and calibration mode, controller 112 may be configured to wait for lapses of predetermined times before sending control signals 206 to switch on and switch off switches in circuit 210 (see FIG. 2 and FIG. 3). The predetermined time can allow controller 112 to have time to determine whether AFE 118 can switch into normal operation or calibration mode, allow controller 112 to verify previous data packet receive at transmitter 110, and/or allow the entire system 100 to stabilize before switching modes.

In the example shown in FIG. 5A, in response to transmitter 110 receiving RPP1, controller 112 can wait for a lapse of predetermined time 510 before switching AFE 118 into calibration mode. For example, in a switch from normal operation mode to auto zero calibration mode, all filters connected to the input paths of controller 112 (e.g., filters 320, 322 in FIG. 3) need to be stabilized to accommodate time division multiplexing of calibration data in output signal 208. During the wait period in predetermined time 510, controller 112 can verify RPP1 and determine whether to switch AFE 118 into calibration mode or not. For example, if RPP1 reflects a voltage that appears to indicate a load transient event, controller 112 may not proceed to switch AFE 118 into calibration mode. If controller 112 determines to proceed with switching AFE 118 into calibration mode, controller 112 can generate and send control signal 206 to control switches in circuit 210, and receive calibration data in output signal 208 within a predetermined time 512. In one embodiment, the predetermined time 510 can be a time constant defined by a filter (e.g., filters 320,322 in FIG. 3) connected between controller 112 and AFE 118.

In response to receiving calibration data within predetermined time 512, controller 112 can verify the received calibration data before proceeding to a next calibration or to switch AFE 118 back to normal operation. In the example shown in FIG. 5A, $t_{power}$ may have sufficient time to allow controller 112 to perform two calibrations. Thus, controller 112 can generate and send control signal 206 to control another set of switches in circuit 210, and receive new calibration data in output signal 208 within another predetermined time 514. In one embodiment, controller 112 can send a first set of control signals (e.g., a first value of control signal 206) to amplifier module 310 for a duration of time equivalent to predetermined time 512, and can send a second set of control signals (e.g., a second value of control signal 206) for a duration of time equivalent to predetermined time 514. The duration to send different control signals to amplifier module 310 can cause amplifier module 310 to generate different calibration data under predetermined times 512, 514, effectively outputting output signal 208 as a time division multiplexed signal. Controller 112 can wait for a lapse of another predetermined time 516 before switching AFE 118 from calibration mode back to normal operation mode. The predetermined time 516 can allow the entire system 100 to stabilize before switching modes. For example, in a switch from auto zero calibration mode back to normal operation mode, all filters connected to the input paths of controller 112 (e.g., filters 320, 322 in FIG. 3) need to be stabilized within predetermined time 516 to accommodate the amplified version of $V_S$ that is being continuously monitored by controller 112. In one embodiment, predetermined times 510, 516 can be equivalent, and predetermined times 512, 514, can be equivalent.

In one embodiment, controller 112 can be configured to determine the predetermined times 510, 512, 514, 516. For example, a duration of $t_{power}$ for a specific wireless transfer protocol can be defined in data packet and dead time information stored in a memory device of controller 112. Also, a duration of predetermined times 510, 512, 514, 516, can be predefined for controller 112. Using predetermined times 510, 516, and $t_{power}$ as known parameters, controller 112 can subtract predetermined times 510 and 516 from $t_{power}$ to obtain an amount of available calibration time. Controller 112 can further determine whether both predetermined times 512, 514, may fit into the amount of available calibration time. If both predetermined times 512, 514 can fit into the amount of available calibration time, then controller 112 can determine that two calibrations can be performed within dead time $t_{power}$. If only predetermined time 512 can fit into the amount of available calibration time, then controller 112 can determine that one calibration can be performed within dead time $t_{power}$.

Figure 5B:
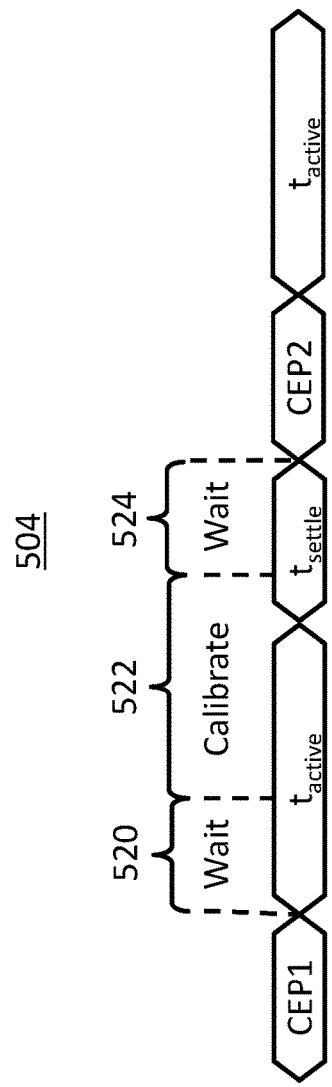
FIG. 5B is another timing diagram of an implementation of calibration and synchronization of ground current sensing amplifier with wireless power transmitter controller in one embodiment.

FIG. 5B is another timing diagram of an implementation of calibration and synchronization of ground current sensing amplifier with wireless power transmitter controller in one embodiment. In FIG. 5B, a timing diagram 504 is shown where a first dead time $t_{active}$ and a second dead time $t_{settle}$ are available between consecutive CEPs, CEP1 and CEP2, for controller 112 to switch AFE 118 from normal operation mode into calibration mode. In response to transmitter 110 receiving CEP1, controller 112 can wait for a lapse of predetermined time 520 before switching AFE 118 into calibration mode. During the wait period in predetermined time 520, controller 112 can verify CEP1 and determine whether to switch AFE 118 into calibration mode or not. If controller 112 determines to proceed with switching AFE 118 into calibration mode, controller 112 can generate and send control signal 206 to control switches in circuit 210, and receive calibration data in output signal 208 within a predetermined time 522. In one embodiment, the predetermined time 520 can be a time constant defined by a filter (e.g., filter 322 in FIG. 3) connected between controller 112 and AFE 118.

In response to receiving calibration data within predetermined time 522, controller 112 can verify the received calibration data before proceeding to a next calibration or to switch AFE 118 back to normal operation. In the example shown in FIG. 5A, a combination of $t_{active}$ and $t_{settle}$ may have sufficient time to allow controller 112 to perform one calibration. Controller 112 can wait for a lapse of another predetermined time 524 before switching AFE 118 from calibration mode back to normal operation mode. The predetermined time 524 can allow the entire system 100 to stabilize before switching modes. In one embodiment, predetermined times 520, 524 can be equivalent. Also, referring to FIG. 5A and FIG. 5B, predetermined times 510, 520, 516, 524 can be equivalent, and predetermined times 512, 514, 522 can be equivalent.

In one embodiment, durations of $t_{active}$ and $t_{settle}$ for a specific wireless transfer protocol can be defined in data packet and dead time information stored in a memory device of controller 112. Also, a duration of predetermined times 520, 522, 524 can be predefined for controller 112. Using predetermined times 520, 524, $t_{active}$ and $t_{settle}$ known parameters, controller 112 can subtract predetermined times 520 and 524 from a combination of $t_{active}$ and $t_{settle}$ to obtain an amount of available calibration time. Controller 112 can further determine that only one calibration can be performed within the amount of available calibration time before receiving the next CEP (e.g., CEP2).

As shown by FIG. 5A and FIG. 5B, the amount of available time for calibration can be based on predetermined times defined in specific wireless transfer protocols, and can be based on the controller 112. For example, the predetermined time 510 to wait before switching into calibration mode can be different between controllers of two different transmitters due to temperature and/or process variations. Therefore, controllers of individual transmitters may be programmed to implement the same processes (e.g., via software or firmware) to determine appropriate timings for switching between normal operation mode and calibration mode. Further, the examples in FIG. 5A and FIG. 5B show that the amount of available time for calibration can be based on whether controller 112 is performing specific functions. For example, FIG. 5A can correspond to a situation where controller 112 is performing FOD only, whereas FIG. 5B can correspond to a situation where controller 112 is performing ASK demodulation. Therefore, the functions being performed by controller 112 can impact the amount of available time for calibration.

In one embodiment, controller 112 can be configured to determine whether to ignore the next communication packet and perform a calibration simultaneously with ASK demodulation. For example, referring to FIG. 5A, if RPP2 arrives during predetermined time 516, RPP2 could be ignored if RPP1 passes with a power level within a predefined range (e.g., range of power level indicating no foreign objects were detected). Similarly, if CEP2 arrives during predetermined time 524, CEP2 could be ignored if CEP1 passes with a power level within a predefined range (e.g., zero or negligible voltage error value). In another embodiment, if RPP1 passes with no errors, controller 112 can determine that RPP2 can be ignored if RPP2 arrives before predetermined time 516 ends, and controller 112 can adjust a time window of calibration mode. For example, the predetermined time 516 can be adjusted to shorten a wait time to stabilize the input signal paths to controller 112 for switching from calibration mode to normal operation mode.

Figure 6:
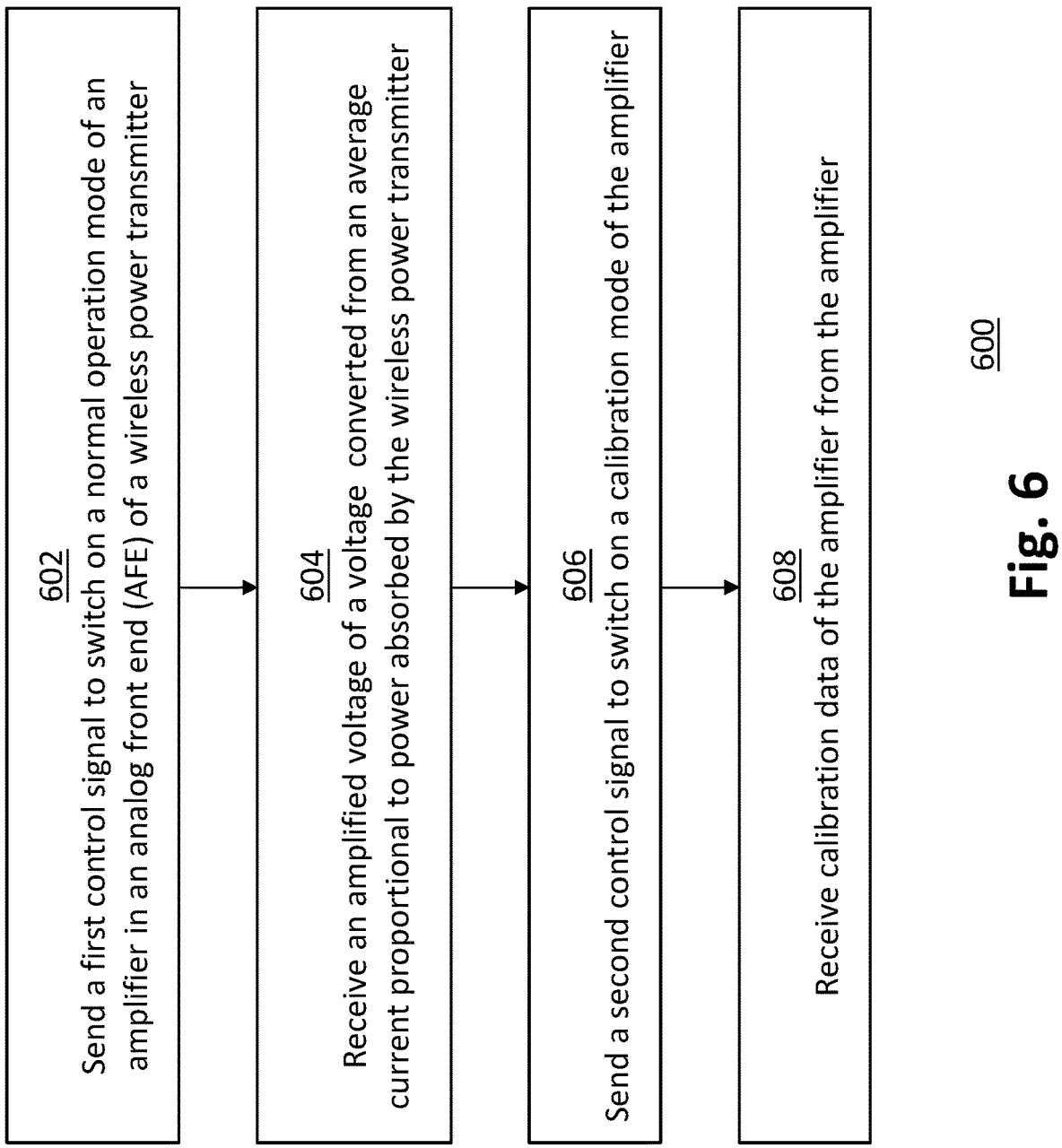
FIG. 6 is a flowchart of an example process that may implement calibration and synchronization of ground current sensing amplifier with wireless power transmitter controller according to an embodiment of the disclosure.

FIG. 6 is a flowchart of an example process that may implement calibration and synchronization of ground current sensing amplifier with wireless power transmitter controller according to an embodiment of the disclosure. The process 600 can include one or more operations, actions, or functions as illustrated by one or more of blocks 602, 604, 606, and/or 608. Although illustrated as discrete blocks, various blocks can be divided into additional blocks, combined into fewer blocks, eliminated, performed in different order, or performed in parallel, depending on the desired implementation.

Process 600 can begin at block 602. At block 602, a controller of a wireless power transmitter can send a first control signal to switch on a normal operation mode of an amplifier in an analog front end (AFE) of a wireless power transmitter.

Process 600 can proceed from block 602 to block 604. At block 604, the controller can receive an amplified voltage of a sense voltage measured across a sense resistor connected to a transmission coil of the wireless power transmitter.

Process 600 can proceed from block 604 to block 606. At block 606, the controller can send a second control signal to switch on a calibration mode of the amplifier. In one embodiment, in response to a lapse of a first predetermined time after receiving the amplified voltage, the controller can send the second control signal to switch on the calibration mode of the amplifier. In one embodiment, the controller can monitor a sequence of data packets being received by the wireless power transmitter. The controller can compare the monitored sequence of data packets with a predefined sequence of data packets. The controller can, based on the comparison, identify a dead time to switch the amplifier from the normal operation mode to the calibration mode.

Process 600 can proceed from block 606 to block 608. At block 608, the controller can receive calibration data of the amplifier from the amplifier. In response to a lapse of a second predetermined time after receiving the calibration data, the controller can generate the first control signal to switch the amplifier from the calibration mode to the normal operation mode.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An apparatus comprising:
   an amplifier configured to amplify a voltage converted from a current proportional to power consumed by a wireless power transmitter; and
   a circuit connected to the amplifier, the circuit being configured to:
   receive a control signal; and
   perform time division multiplexing on an output of the amplifier according to the control signal, wherein a time division multiplexed output of the amplifier comprises calibration data of the amplifier, and the time division multiplexed output comprises signals being outputted in a synchronized manner.

2. The apparatus of claim 1, wherein the calibration data comprises at least one of:
   an auto zero offset voltage of the amplifier;
   a reference gain voltage of the amplifier; and
   a zero current reference voltage of the amplifier.

3. The apparatus of claim 1, wherein the circuit comprises:
   a first switch connected to a first input terminal of the circuit and a non-inverting input terminal of the amplifier;
   a second switch connected to a second input terminal of the circuit and an inverting input terminal of the amplifier;
   a third switch connected to a first node and a second node, wherein the first node is between the first switch and the non-inverting input terminal of the amplifier, and the second node is between the second switch and the second input terminal of the circuit;
   a fourth switch connected to an output terminal of the amplifier and an output pin of an analog front end (AFE) that includes the amplifier; and
   a fifth switch connected between a reference voltage and a third node between the fourth switch and the output pin of the AFE.

4. The apparatus of claim 3, wherein in response to the control signal switching on the first switch, the second switch, and the fourth switch, and in response to the control signal switching off the third switch and the fifth switch, the amplifier amplifies the voltage converted from the current proportional to power absorbed by the wireless power transmitter.

5. The apparatus of claim 3, wherein in response to the control signal switching on the second switch, the third switch and the fourth switch, and in response to the control signal switching off the first switch and the fifth switch, the amplifier outputs the calibration data indicating an auto zero offset voltage of the amplifier.

6. The apparatus of claim 3, wherein in response to the control signal switching on the fifth switch, and in response to the control signal switching off the fourth switch, the amplifier outputs the calibration data indicating a reference voltage sampled by the amplifier.

7. The apparatus of claim 3, wherein the circuit further comprises:
   a sixth switch connected between the reference voltage and a fourth node between the first switch and the non-inverting input terminal of the amplifier, wherein a first resistor is connected between the sixth switch and the reference voltage and a ground node;
   a seventh switch connected between a fifth node between the first switch and the non-inverting input terminal of the amplifier and a sixth node between the second switch and the inverting input terminal of the amplifier, wherein a second resistor is connected between the seventh switch and the fifth node;
   an eighth switch connected between the second switch and the inverting input terminal of the amplifier;
   wherein in response to the control signal switching on the fourth switch, the sixth switch, and the eighth switch, and in response to the control signal switching off the first switch, the second switch, the third switch, the fifth switch, and the seventh switch, the amplifier outputs the calibration data indicating a first reference gain voltage of the amplifier, the first reference gain volage being a first scaled value of the reference voltage; and
   wherein in response to the control signal switching on the fourth switch, the sixth switch, the seventh switch, and the eighth switch, and in response to the control signal switching off the first switch, the second switch, the third switch, and the fifth switch, the amplifier outputs the calibration data indicating a second reference gain voltage of the amplifier, the second reference gain volage being a second scaled value of the reference voltage.

8. A wireless power transmitter comprising:
   a controller;
   an amplifier module comprising:
   an amplifier configured to amplify a voltage converted from a current proportional to power consumed by the wireless power transmitter;
   a circuit connected to the amplifier, the circuit being configured to:
   receive a control signal from the controller; and
   perform time division multiplexing on an output of the amplifier according to the control signal, wherein a time division multiplexed output of the amplifier comprises calibration data of the amplifier,
   the amplifier being further configured to output the time division multiplexed output to the controller, wherein the time division multiplexed output comprises signals being outputted in a synchronized manner.

9. The wireless power transmitter of claim 8, wherein the calibration data comprises at least one of:
   an auto zero offset voltage of the amplifier;
   a reference gain voltage of the amplifier; and
   a zero current reference voltage of the amplifier.

10. The wireless power transmitter of claim 8, wherein the circuit comprises:
    a first switch connected to a first input terminal of the circuit and a non-inverting input terminal of the amplifier;
    a second switch connected to a second input terminal of the circuit and an inverting input terminal of the amplifier;
    a third switch connected to a first node and a second node, wherein the first node is between the first switch and the non-inverting input terminal of the amplifier, and the second node is between the second switch and the second input terminal of the circuit;
    a fourth switch connected to an output terminal of the amplifier and an output pin of an analog front end (AFE) that includes the amplifier; and
    a fifth switch connected between a reference voltage and a third node between the fourth switch and the output pin of the AFE.

11. The wireless power transmitter of claim 10, wherein in response to the control signal switching on the first switch, the second switch, and the fourth switch, and in response to the control signal switching off the third switch and the fifth switch, the amplifier amplifies the voltage converted from the current proportional to power absorbed by the wireless power transmitter.

12. The wireless power transmitter of claim 10, wherein in response to the control signal switching on the second switch, the third switch and the fourth switch, and in response to the control signal switching off the first switch and the fifth switch, the amplifier outputs the calibration data indicating an auto zero offset voltage of the amplifier.

13. The wireless power transmitter of claim 10, wherein in response to the control signal switching on the fifth switch, and in response to the control signal switching off the fourth switch, the amplifier outputs the calibration data indicating a reference voltage sampled by the amplifier.

14. The wireless power transmitter of claim 10, wherein the circuit further comprises:
   a sixth switch connected between the reference voltage and a fourth node between the first switch and the non-inverting input terminal of the amplifier, wherein a first resistor is connected between the sixth switch and the reference voltage and a ground node;
   a seventh switch connected between a fifth node between the first switch and the non-inverting input terminal of the amplifier and a sixth node between the second switch and the inverting input terminal of the amplifier, wherein a second resistor is connected between the seventh switch and the fifth node;
   an eighth switch connected between the second switch and the inverting input terminal of the amplifier;
   wherein in response to the control signal switching on the fourth switch, the sixth switch, and the eighth switch, and in response to the control signal switching off the first switch, the second switch, the third switch, the fifth switch, and the seventh switch, the amplifier outputs the calibration data indicating a first reference gain voltage of the amplifier, the first reference gain volage being a first scaled value of the reference voltage; and
   wherein in response to the control signal switching on the fourth switch, the sixth switch, the seventh switch, and the eighth switch, and in response to the control signal switching off the first switch, the second switch, the third switch, and the fifth switch, the amplifier outputs the calibration data indicating a second reference gain voltage of the amplifier, the second reference gain volage being a second scaled value of the reference voltage.

15. The wireless power transmitter of claim 8, wherein the controller is configured to:
   receive the amplified voltage;
   in response to a lapse of a first predetermined time, send the control signal to switch the amplifier from a normal operation mode to a calibration mode;
   receive the calibration data of the amplifier; and
   in response to a lapse of a second predetermined time, generate the control signal to switch the amplifier from the calibration mode to the normal operation mode.

16. The wireless power transmitter of claim 8, wherein the controller is configured to:
   monitor a sequence of data packets being received by the wireless power transmitter; compare the monitored sequence of data packets with a predefined sequence of data packets; and
   based on the comparison, identify a dead time to switch the amplifier from a normal operation mode to a calibration mode.

17. A method for calibrating a wireless power transmitter, the method comprising:
   sending, by a controller, a first control signal to switch on a normal operation mode of an amplifier in an analog front end of a wireless power transmitter;
   receiving, by the controller, an amplified voltage of a voltage converted from an average current proportional to power consumed by the wireless power transmitter;
   sending, by the controller, a second control signal to switch on a calibration mode of the amplifier; and
   receiving, by the controller, a time division multiplexed signal comprising calibration data of the amplifier from the amplifier, wherein the time division multiplexed signal comprises signals being transmitted from the amplifier to the controller in a synchronized manner.

18. The method of claim 17, further comprising:
   in response to a lapse of a first predetermined time after receiving the amplified voltage, sending the second control signal to switch on the calibration mode of the amplifier; and
   in response to a lapse of a second predetermined time after receiving the calibration data, generating the first control signal to switch the amplifier from the calibration mode to the normal operation mode.

19. The method of claim 17, further comprising:
   monitoring a sequence of data packets being received by the wireless power transmitter; comparing the monitored sequence of data packets with a predefined sequence of data packets; and
   based on the comparison, identifying a dead time to switch the amplifier from the normal operation mode to the calibration mode.

20. The method of claim 17, further comprising:
   receiving a data packet at the wireless power transmitter under the normal operation mode;
   determining that the data packet has no errors; and
   in response to the data packet having a power level within a predefined range, adjusting a time window of the calibration mode.

\* \* \* \* \*